(12) United States Patent
Mangaroo et al.

(10) Patent No.: US 7,992,787 B2
(45) Date of Patent: Aug. 9, 2011

(54) REED SWITCH MECHANISM FOR A PORTABLE TERMINAL

(75) Inventors: Alan Mangaroo, Oakville (CA); Bo Xu, Mississauga (CA); Tom Hussey, Rockwood (CA)

(73) Assignee: Psion Teklogix Inc., Mississauga, Ontario (CA)

( * ) Notice: Subject to any disclaimer, the term of this patent is extended or adjusted under 35 U.S.C. 154(b) by 564 days.

(21) Appl. No.: 12/181,539

(22) Filed: Jul. 29, 2008

(65) Prior Publication Data

US 2010/0020476 A1   Jan. 28, 2010

Related U.S. Application Data

(63) Continuation-in-part of application No. 12/181,210, filed on Jul. 28, 2008.

(51) Int. Cl.
*G06K 7/10* (2006.01)
(52) U.S. Cl. .............................. 235/472.01; 235/462.45
(58) Field of Classification Search ............. 235/462.01, 235/462.45, 462.47, 462.3, 472.01, 472.02
See application file for complete search history.

(56) References Cited

U.S. PATENT DOCUMENTS

| | | | | |
|---|---|---|---|---|
| 3,727,030 A | * | 4/1973 | McMurtry | 235/462.49 |
| 3,735,142 A | * | 5/1973 | Harr et al. | 235/462.45 |
| 4,578,628 A | * | 3/1986 | Siwiak | 320/127 |
| 5,675,138 A | * | 10/1997 | La | 235/462.44 |
| 6,109,528 A | * | 8/2000 | Kunert et al. | 235/472.01 |
| 6,330,973 B1 | * | 12/2001 | Bridgelall et al. | 235/462.45 |
| 6,726,106 B1 | * | 4/2004 | Han et al. | 235/472.01 |
| 7,644,865 B2 | * | 1/2010 | Barkan | 235/462.24 |
| 2007/0272756 A1 | * | 11/2007 | Brock et al. | 235/462.25 |
| 2009/0108076 A1 | * | 4/2009 | Barkan et al. | 235/462.48 |

* cited by examiner

*Primary Examiner* — Daniel A Hess
(74) *Attorney, Agent, or Firm* — Occhiuti Rohlicek & Tsao LLP

(57) ABSTRACT

A portable terminal assembly comprises an enclosure having a distal end wall and a proximal end wall connected to a pair of sidewalls such that the enclosure walls connect a bottom surface to a top surface having a user interface to define an enclosure interior. The enclosure has a power source compartment positioned in the enclosure interior. The cover couples to the compartment situated in an opening in the bottom surface. The cover housing of the cover includes a cover surface, a pair of cover sidewalls, a proximal cover end wall and a distal cover end wall such that the cover walls extend from the cover surface to define the cover interior. A magnet is coupled to the cover interior, such that the magnet has a sufficient magnetic field strength for affecting the state of the contacts of a switch. The switch is mounted in the interior of the enclosure, such that the switch is coupled to at least one component receiving power from the power source when positioned in the compartment. It is recognized that the proximity of the magnet to the switch affects the state of the contacts and therefore the supply of power to the at least one component.

20 Claims, 13 Drawing Sheets

REED SWITCH MECHANISM FOR A PORTABLE TERMINAL

CROSS-REFERENCE PARAGRAPH

This application is a continuation-in-part of U.S. application Ser. No. 12/181,210, filed on Jul. 28, 2008, the content of which is incorporated by reference in its entirety.

FIELD OF THE INVENTION

This invention relates to a switch for controlling operation of a portable terminal.

BACKGROUND

It is generally known to provide a handle for scanning device such as a portable scanner for logistics environments. However, such known handles are typically either molded as an integral portion of the housing of the scanning device, or are connected to the housing fasteners and corresponding tools. However, current scanning devices may have bulky handles that are not desirable for use in all field situations.

Further, current scanners can have bulky compartment covers, such as for battery compartments, which are not ergonomically designed and may cause discomfort to the user of the scanning device. It is also recognised that current scanning devices may be difficult to hold and operate with one hand (by the user) without having to resort to use of a handle grip that may or may not have enough room for mounting on the bottom surface of the scanning device.

Further, current portable scanning devices can have unexpected power interruptions, such as when the battery is removed from the battery compartment. As well, mounting efficiency for modular components in the battery compartment cover can be problematic.

SUMMARY

It is an object of the present invention to provide a cover and assembly for a portable terminal to obviate or mitigate at least some of the above-presented disadvantages.

Current portable scanning devices can have unexpected power interruptions, such as when the battery is removed from the battery compartment. As well, mounting efficiency for modular components in the battery compartment cover can be problematic. Contrary to current portable terminal assemblies there is provided a portable terminal assembly comprising an enclosure having a distal end wall and a proximal end wall connected to a pair of sidewalls such that the enclosure walls connect a bottom surface to a top surface having a user interface to define an enclosure interior. The enclosure has a power source compartment positioned in the enclosure interior. The cover couples to the compartment situated in an opening in the bottom surface. The cover housing of the cover includes a cover surface, a pair of cover sidewalls, a proximal cover end wall and a distal cover end wall such that the cover walls extend from the cover surface to define the cover interior. A magnet is coupled to the cover interior, such that the magnet has a sufficient magnetic field strength for affecting the state of the contacts of a switch. The switch is mounted in the interior of the enclosure, such that the switch is coupled to at least one component receiving power from the power source when positioned in the compartment. It is recognised that the proximity of the magnet to the switch affects the state of the contacts and therefore the supply of power to the at least one component.

One aspect provided is a portable terminal assembly comprising: an enclosure having a distal end wall and a proximal end wall connected to a pair of sidewalls such that the enclosure walls connect the bottom surface to a top surface having a user interface to define an enclosure interior, a power source compartment positioned in the enclosure interior; a cover for coupling to the compartment situated in an opening in the bottom surface; a cover housing of the cover including a cover surface, a pair of cover sidewalls, a proximal cover end wall and a distal cover end wall such that the cover walls extend from the cover surface to define a cover interior; a magnet coupled to the cover interior, the magnet having a sufficient magnetic field strength for affecting a state of contacts of a switch; and the switch mounted in the interior of the enclosure, the switch coupled to at least one component receiving power from a power source when positioned in the compartment; wherein the proximity of the magnet to the switch affects the state of the contacts and therefore the supply of power to the at least one component.

A further aspect provided is a cover for coupling to a power source compartment situated in an opening in a surface of an enclosure of portable terminal, the portable terminal including the enclosure having a distal end wall and a proximal end wall connected to a pair of sidewalls such that the enclosure walls connect the bottom surface to a top surface having a user interface to define an enclosure interior, the compartment positioned in the enclosure interior, the cover comprising: a housing including a cover surface, a pair of cover sidewalls, a proximal cover end wall and a distal cover end wall such that the cover walls extend from the cover surface to define a cover interior; a magnet coupled to the cover interior, the magnet having a sufficient magnetic field strength for affecting a state of contacts of a switch; wherein the switch is mounted in the interior of the enclosure.

BRIEF DESCRIPTION OF THE DRAWINGS

Exemplary embodiments of the invention will now be described in conjunction with the following drawings, by way of example only, in which.

DETAILED DESCRIPTION OF THE PREFERRED EMBODIMENT(S)

Portable Terminal 10

Figure 1:
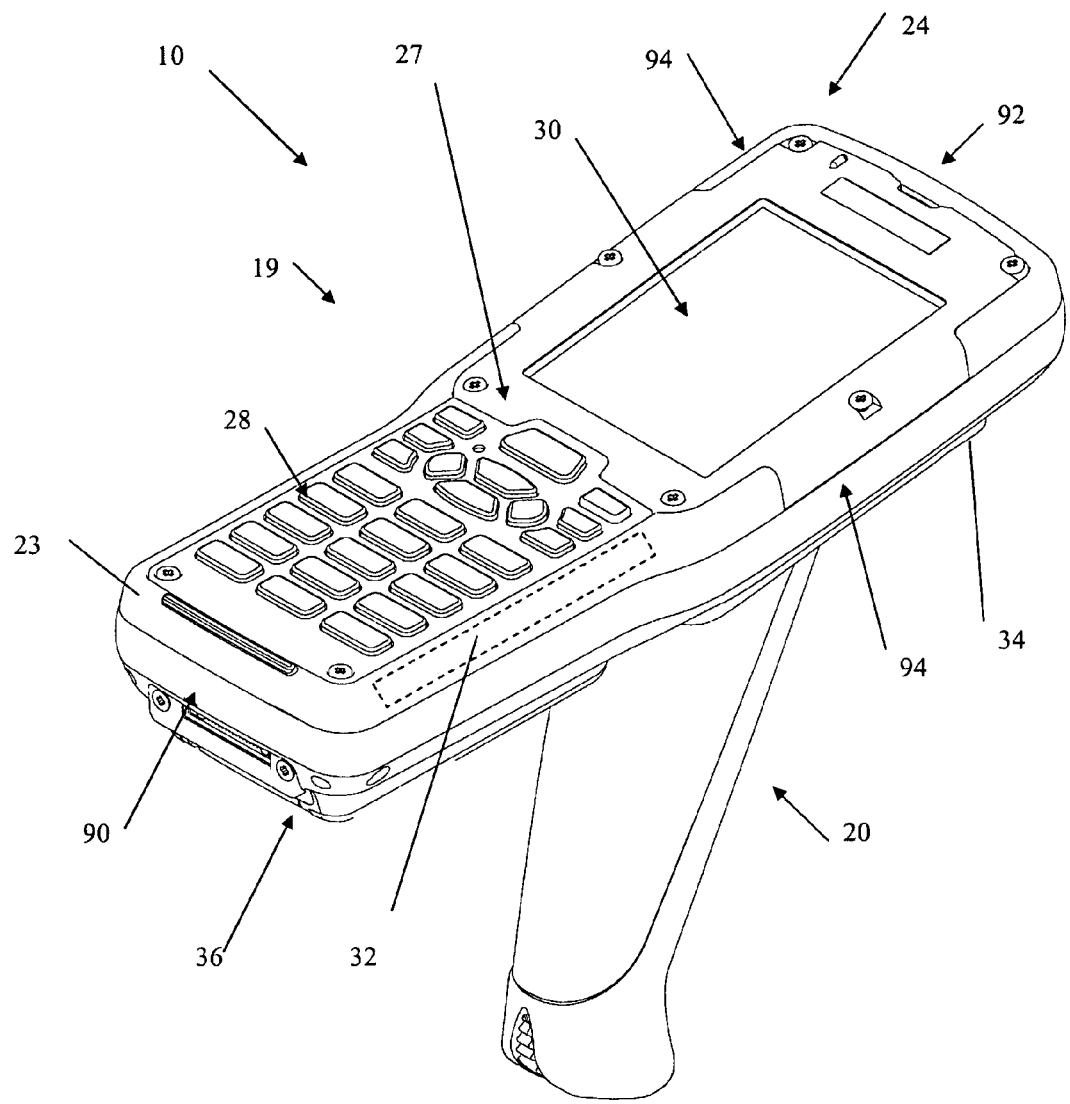
FIG. 1 is a top perspective view of components of a portable terminal for interaction with a logistics environment.
Figure 2:
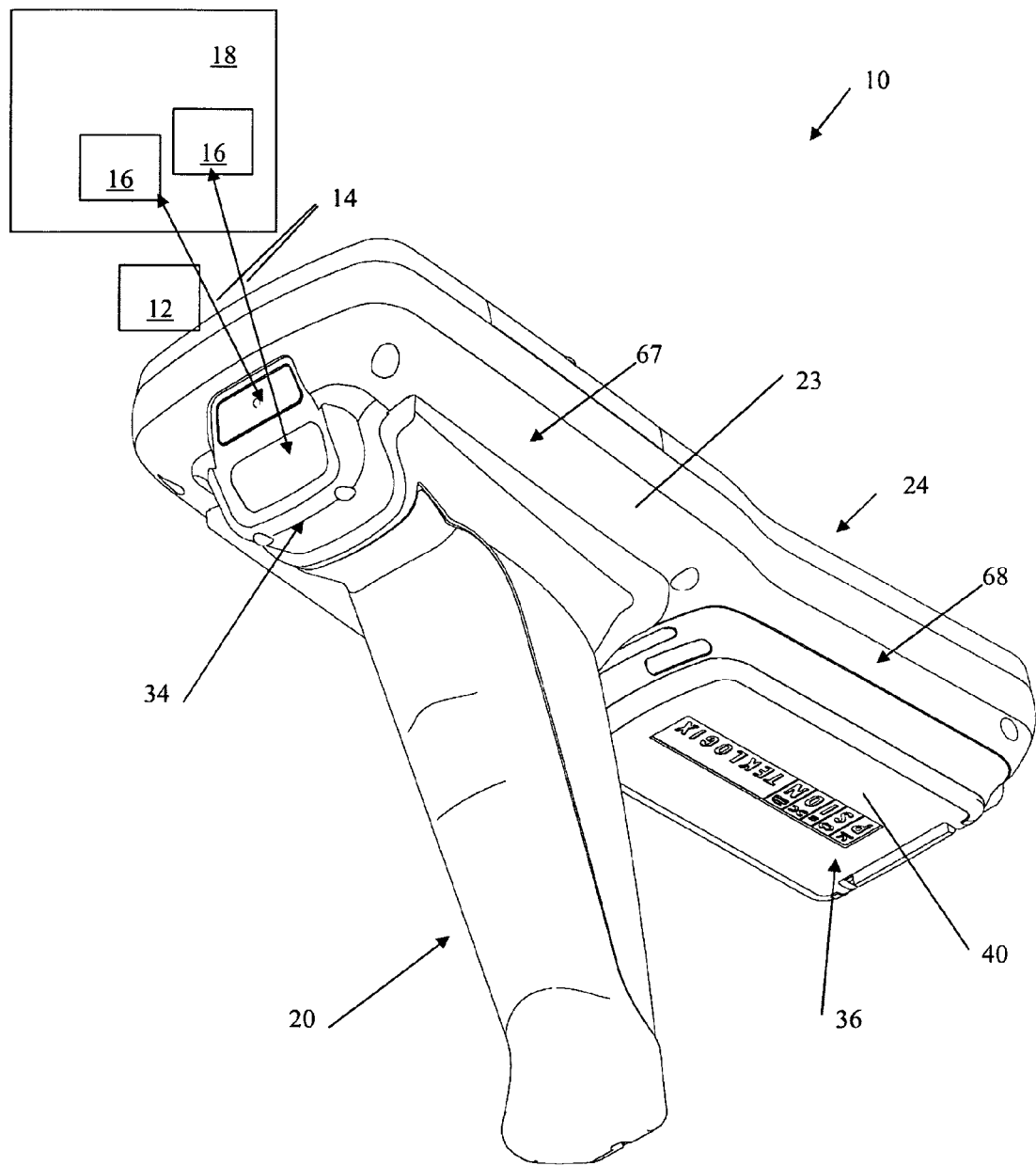
FIG. 2 is a bottom perspective view of the portable terminal of FIG. 1.

Referring to FIGS. 1 and 2, shown is a portable terminal 10 for providing imaging and/or scanning features in data capture/communications 12 and asset tracking/management, for example in wireless communication 14 with tracking objects 16 (e.g. barcode labels and/or RFID tags) present in one or more logistics environments 18 (e.g. industrial, retail, supply chain). It is recognised that the tracking objects 16 can be attached to products that are being transported from one location to another in the logistics environment 18. Examples of these environments 18 can include such as but not limited to: front store retail and/or warehousing for mobile stock checking, price checking, and merchandising; and utilities for meter reading, surveying, parking enforcement, and asset tracking.

The portable terminal 10 has an optional handle 20, connected via a release securable connection, to an enclosure 23 of a handheld computer 24. It is also recognised that the handle 20 may be permanently or otherwise fixedly attached to the enclosure 23 by fastening means such as but not limited to: protrusions engaged in slots, latch mechanisms, fasteners (e.g. screws), adhesives or other bonding agents, etc. Further, the handle 20 may be an integral component of at least a portion of the enclosure 23 (e.g. molded as part of the enclosure 23). The enclosure has a proximal end wall 90, a distal end wall 92, and a pair of side walls 94.

The computer 24 has a number of components 19 including a user interface 26 located on a front/top surface 27, including a keyboard 28 and a display 30 (e.g. touch screen), one or more onboard processors 32 (e.g. shown by ghosted lines as inside of the enclosure 23), and a scanner/radio communications module 34 (e.g. laser, WLAN with VoIP and Bluetooth, imager, RFID scanner, etc.—inside of the enclosure 23), for example located on a back surface 67 of the terminal 10, for facilitating the wireless communication 14. The portable terminal 10 also has an onboard power source 36 located adjacent to a back/bottom surface 68 of the back/bottom surface 67 for helping to satisfy power requirements of the onboard processor(s) 32, the user interface 26, and optionally the communication module 34. The power source 36 (e.g. battery) is contained within the enclosure 23 by a cover 40 that is coupled to the enclosure 23 on the back surface 67 (e.g. located adjacent to the back surface 68), as either removable or as an integral part of the enclosure 23, as further described below.

Figure 3:
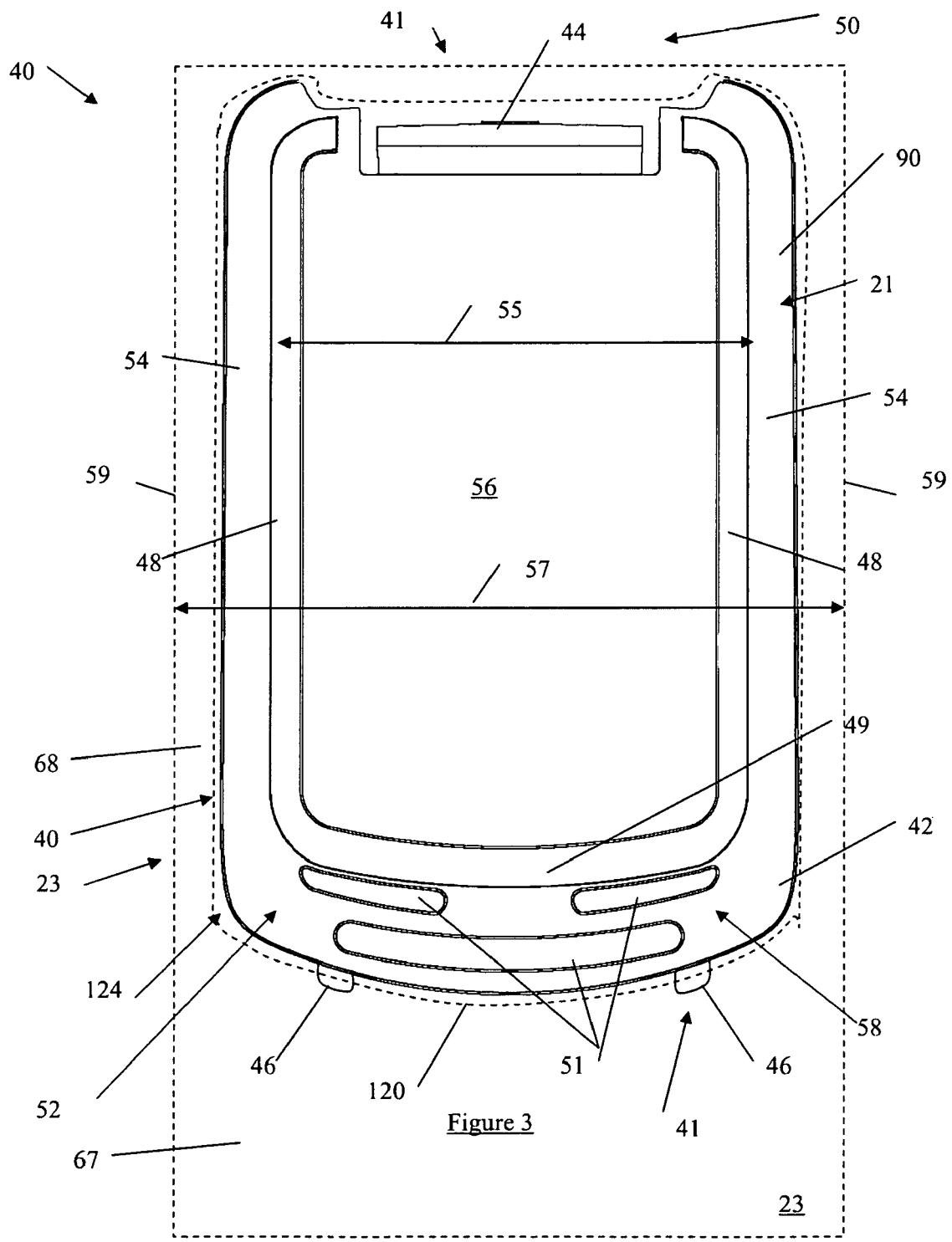
FIG. 3 is a top view of a cover of the housing of terminal of FIG. 1.
Figure 6:
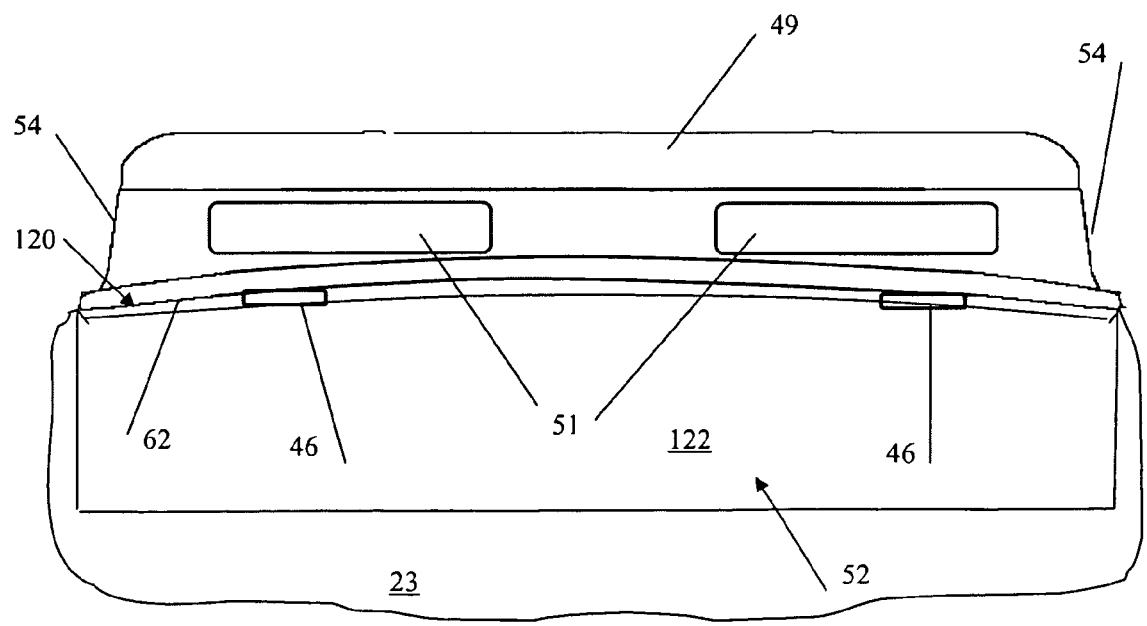
FIG. 6 a distal side view of the cover of FIG. 3 assembled on the housing of the terminal of FIG. 1.

For example, shown in FIGS. 3 and 6 is a compartment 122 is positioned in the enclosure 23 interior and is configured for holding one or more components 19 (see FIG. 1) of the portable terminal 10, e.g. a power source 36 such as a battery. For example, the cover 40 is configured for mating/coupling (e.g. permanently or releasably) to the compartment 122 situated in an opening/aperture 124 in the bottom surface 67 at the proximal end 90 of the enclosure 23, such that the cover 40 configured for grasping by the user with at least one finger (see FIG. 11). Accordingly, the enclosure has the distal end wall 92 and the proximal end wall 90 connected to the pair of sidewalls 94 such that the enclosure walls 90,92,94 connect the bottom surface 67,68 to the top surface 27 (e.g. having the user interface 26) to define the enclosure interior, such that the compartment 122 is positioned/located in the enclosure interior.

It is recognised that in the description, the terms "housing" and "enclosure" can be used interchangeably.

Cover 40 Structure

Referring to FIG. 2, the cover 40 is shaped for grasping by a hand 80 (see FIG. 11) of the user (of the portable terminal 10) when the handle 20 is not coupled to the computer 24. The cover 40 has a proximal end portion/wall 50, a distal end portion/wall 52, a pair of side wall portions 54 extending between the proximal 50 and distal 52 ends, and a cover surface 56 extending between the ends 50, 52 and the side wall portions 54, to define an interior 88. The wall portions 52,54 extend/project in an outward direction in relation to the backside surface 68 of the terminal 10. Accordingly, referring to FIG. 5, a cover body/housing 21 includes the cover surface 56, the pair of cover sidewalls 54, the proximal cover end wall 50 and the distal cover end wall 52 such that the cover walls 50,52,54 extend from the cover surface 56 to define a cover interior 88.

Referring to FIG. 3, a separation distance 55 (e.g. width) between the side wall portions 54 is configured as less than the separation distance 57 (e.g. width) between the sides 59 of the enclosure 23 adjacent to the side wall portions 54 of the cover 40. Accordingly, the surface 68 is oriented at an angle greater than 180 degrees with the enclosure sides 59, measured externally (e.g. of the terminal 10) from the surface 68 to the enclosure side 59, and the surface 68 is oriented at an angle less than 180 degrees with the side walls 54, measured externally (e.g. of the terminal 10) from the surface 68 to the side wall 54.

Figure 5:
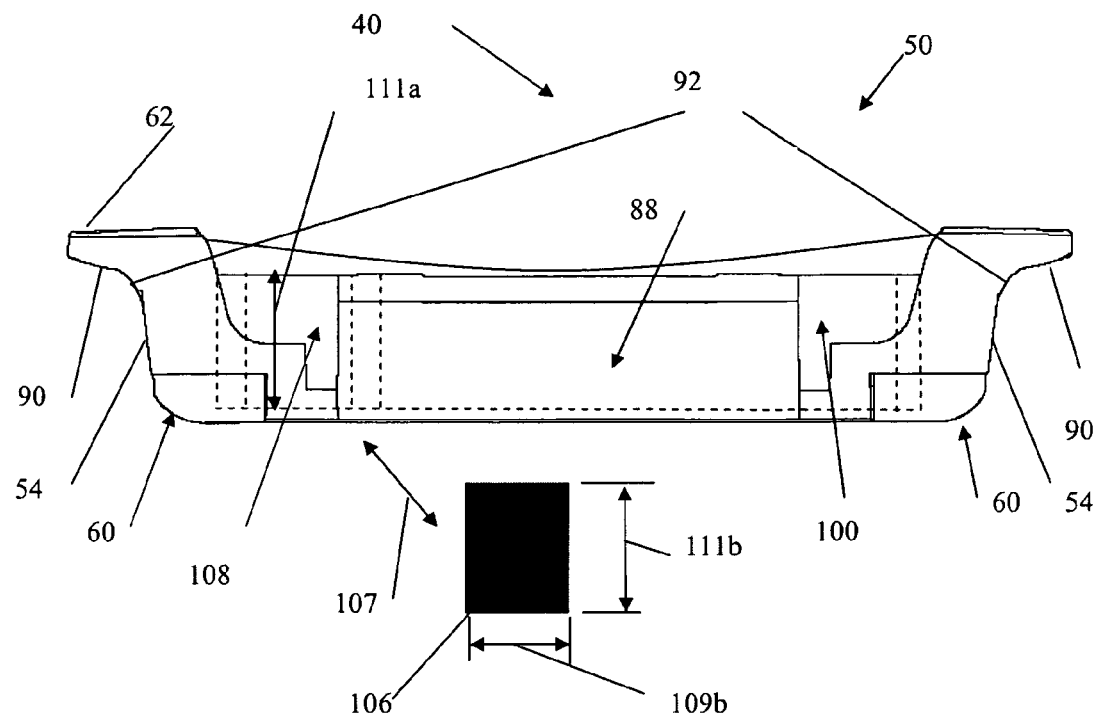
FIG. 5 is a proximal side view of the cover of FIG. 3.
Figure 11:
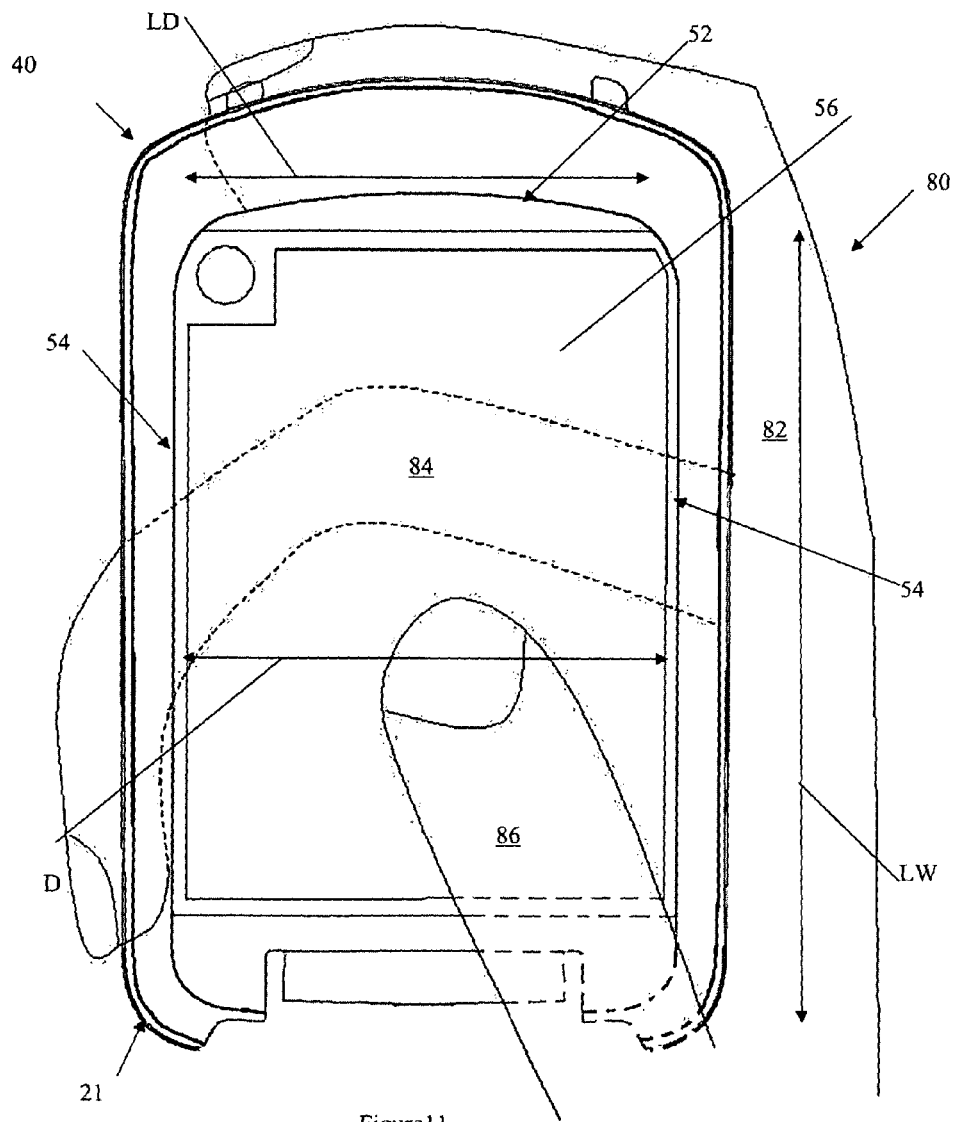
FIG. 11 shows an example grip of a user's hand of the cover when assembled on the terminal of FIG. 1.

Referring to FIGS. 5 and 11, the wall portion(s) 52,54 can be connected to a base portion 90 (e.g. rim) of the cover 40, and are interconnected by an arcuate corner portion 92 of the cover 40, thus defining an arcuate shaped (i.e. concave in curvature) peripheral corner of the cover 40, so as to accommodate the convex shape of the user's index finger 82 and/or middle finger 84 used to grasp the cover 40 (in absence of the handle 20—see FIG. 1). Further, the user's thumb 84 can be used to position over the keyboard 28 (see FIG. 1) when the cover is grasped by the user's finger(s) 80,82. For example, as shown in FIG. 11, the user's index finger 82 is positioned adjacent to the distal end wall 54 and one of the side walls 52, the user's middle finger 84 is positioned across the cover surface 56 and adjacent to the other of the side walls 52, and the user's thumb 86 is positionable over the front surface 27 of the terminal 10 (see FIG. 1).

Figure 12:
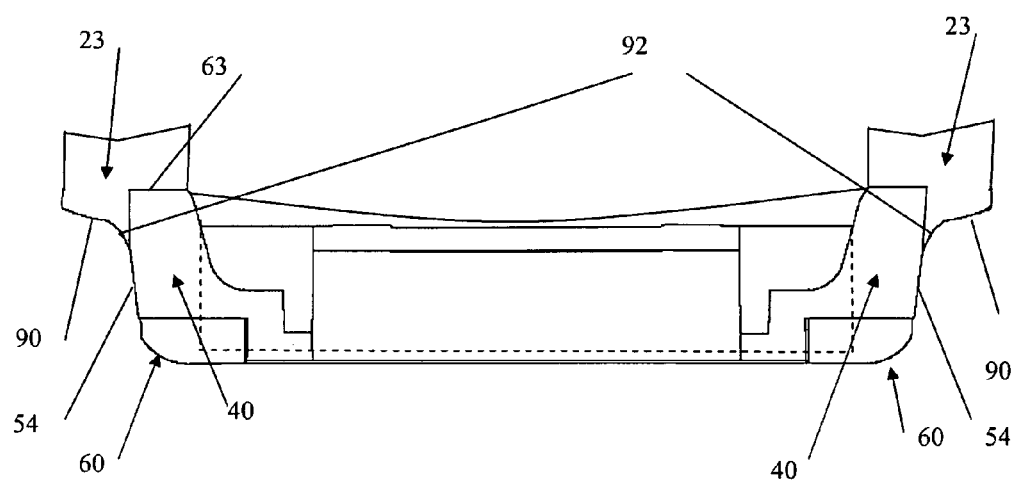
FIG. 12 is an alternative embodiment of the cover of FIG. 5.
Figure 13:
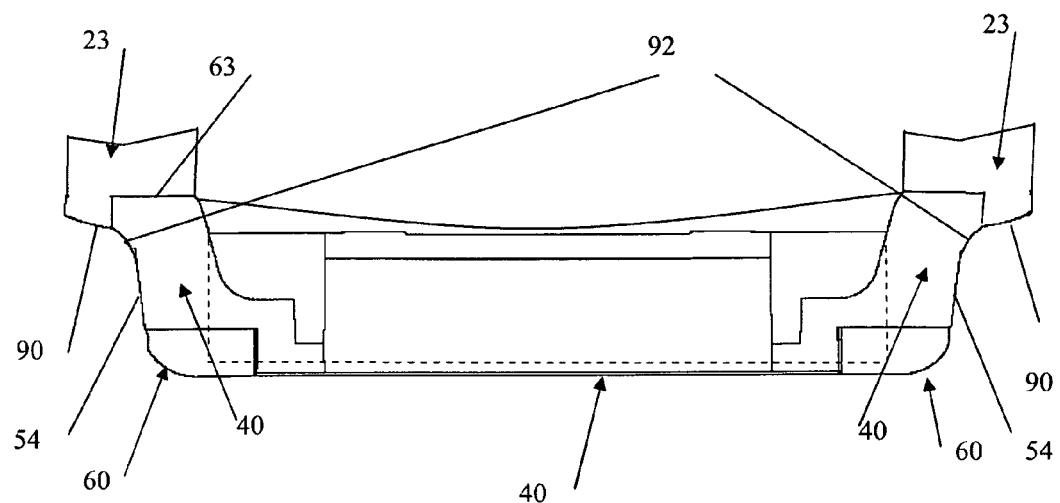
FIG. 13 is a further alternative embodiment of the cover of FIG. 5.

Further to the above, as alternative embodiments to that shown in FIG. 5, it is recognised that the surface 68 can be composed of a combination of the base portion 90 of the cover 40 and the back surface (e.g. surface 67) of the terminal 10 (see FIG. 5) as shown in FIG. 5, can be composed only of the base portion 90 (not shown)—e.g. such that the sides 59 extend from the base portion 90 once the cover 40 is coupled to the enclosure 23, can be composed only of the back surface (e.g. surface 67) of the terminal 10 (see FIGS. 12 and 13), such that the base portion 90 and/or the corner portion 92 may be part of the enclosure 23 rather than part of the body 21 of the cover 40. In any event, either alone by the cover body 21 or in combination with the enclosure 23, the separation distance 55 (e.g. width) between the side wall portions 54 is configured as less than the separation distance 57 (e.g. width) between the sides 59 of the enclosure 23 adjacent to the side wall portions 54 of the cover 40, so as to facilitate the grasping of the user's finger(s) 82, 84 (see FIG. 11) of the terminal 10 in substitution/preference of/to the handle 20.

Accordingly, the rim 90 can be positioned adjacent to the distal cover end wall 52, such that the rim 90 and the distal cover end wall 52 cooperate to form a shaped profile to facilitate the grasping by a finger of the user. Further, it is recognised that cover housing 21 can include a side rim 90 positioned adjacent to at least one of the cover side walls 54, the side rim 90 and the at least one cover side wall 54 cooperating to form the shaped profile (e.g. arcuate such as concave) to facilitate the grasping by the finger of the user. It is recognised that the mating surface 62 can be positioned on the rim 90.

Further, the cover 40 has a mating surface 62 (see FIG. 4) at a base of the cover housing 21 and defined by the walls 50, 52, 54, the mating surface 62 is configured to mate with the bottom surface 67,68 of the enclosure 23 (e.g. adjacent to the opening 124), such that when assembled the pair of cover side walls 54 extend outwardly from the back surface 67,68 and each of the pair of cover sidewalls 54 is inset as spaced apart from the corresponding side wall 94 of the pair of sidewalls 94 of the enclosure 23, and the distal cover end wall 52 extends outwardly from the back surface 67, 68 and is adapted to be spaced apart from the corresponding distal end wall 92 (see FIG. 1).

Grips on Body 21

Figure 4:
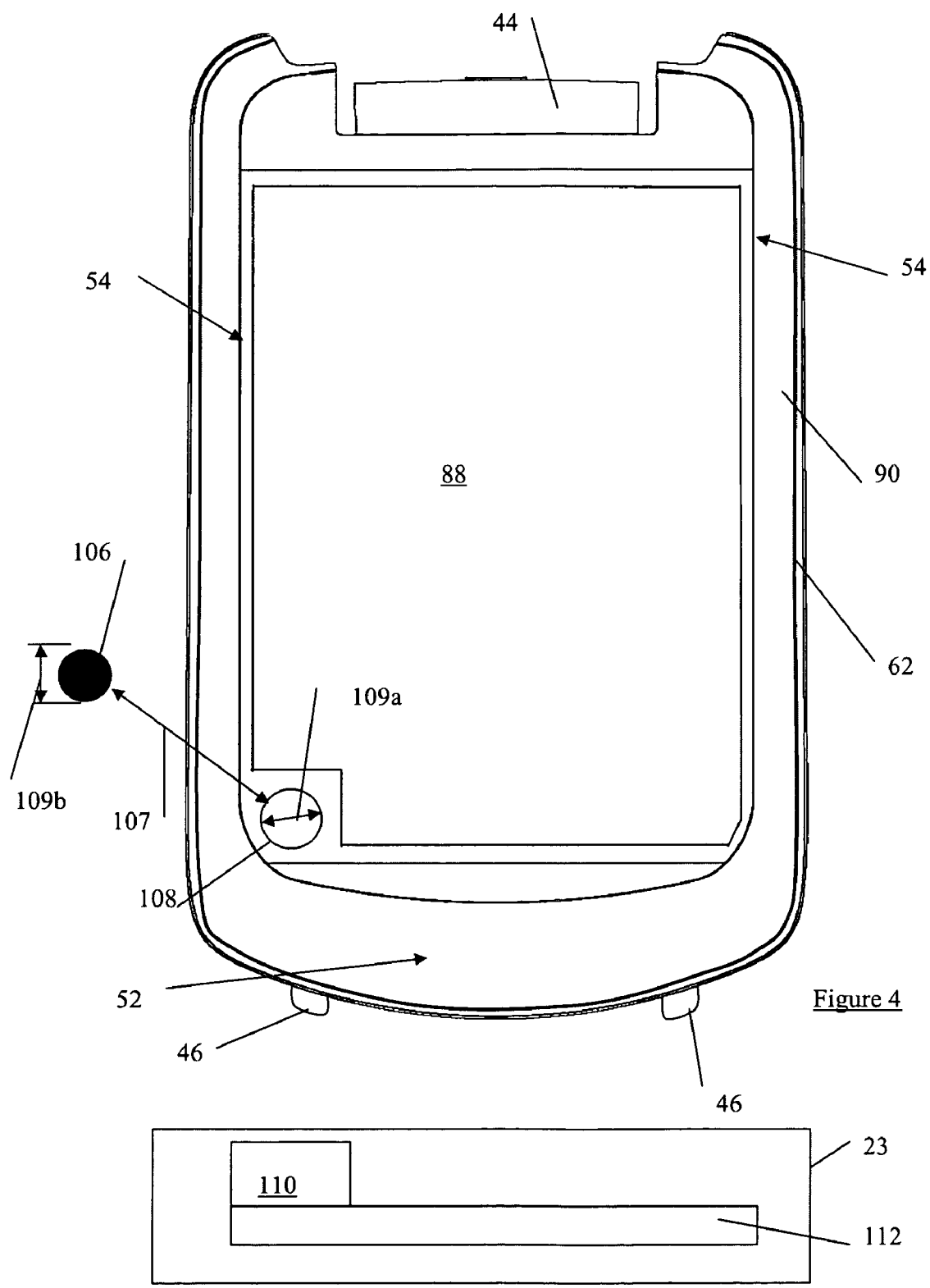
FIG. 4 shows an example interior configuration of the cover of FIG. 3.
Figure 7:
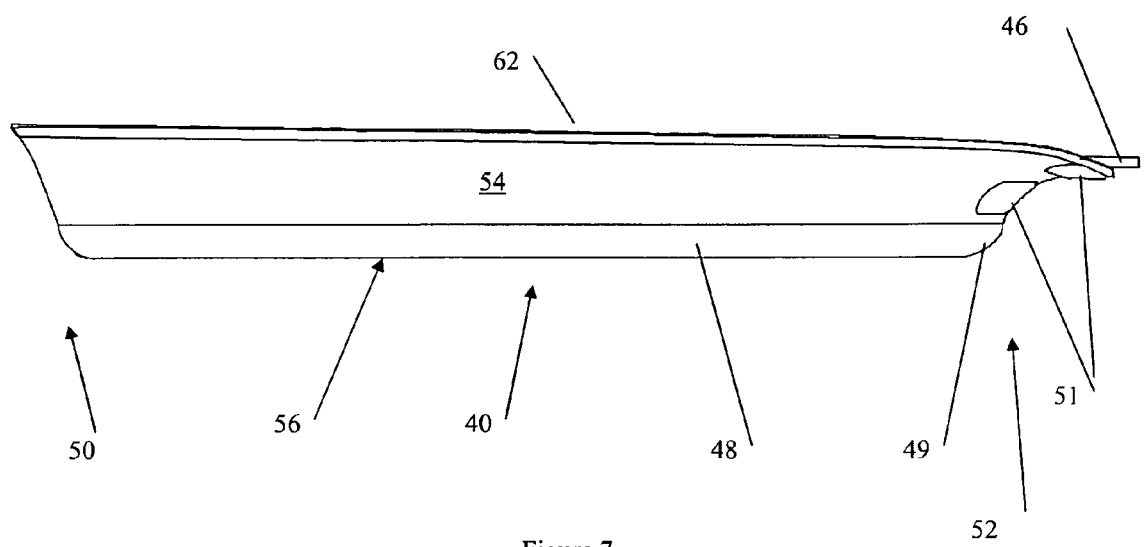
FIG. 7 is top view of the cover of FIG. 3.

Referring to FIGS. 3, 4, and 7, shown is a body 21 of the cover 40 having the proximal end/portion 50, the distal end wall 52, the pair of side wall portions 54 extending between the proximal 50 and distal 52 ends, and the cover surface 56 extending between the ends 50, 52 and the side wall portions 54, to define the interior 88. The interior 88, for example in cooperation with the enclosure 23, helps to define the compartment 122 for the power source 36. Located on the external surface of one or more (on both is shown) of the side wall portions 54 can be a side grip portion 48. Located on the distal end wall can be a first end grip portion 49 that may or may not be integral (e.g. continuous) with the side grip portion(s) 48. Further, the distal end wall 52 can also have one or more second grip portions 51, positioned on the body 21 wall as further described below. Accordingly, the cover 40 and/or the bottom surface 67,68 adjacent to the cover 40 (e.g. when the surface 67,68 includes the rim 90) can have one or more grip portions 48, 49, 51 attached on the exterior surface of the cover housing 21, and/or the enclosure 23, such that the grip portions 48,49,51 are composed of a resilient material for facilitating grasping by the at least one finger (of the user) of the cover housing 21 (see FIG. 11).

Figure 8:
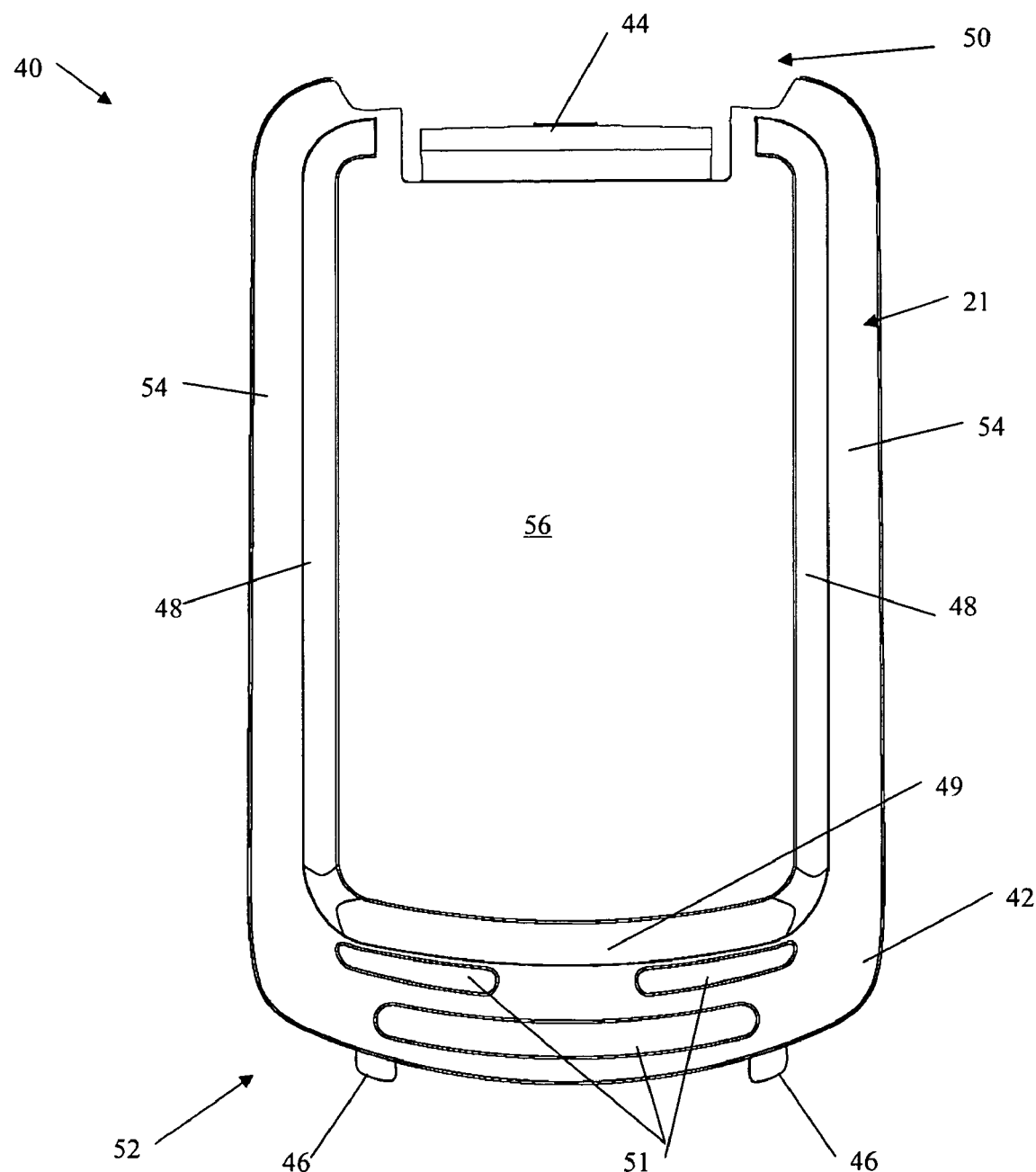
FIG. 8 is top view of an alternative embodiment of the cover of FIG. 3.
Figure 10:
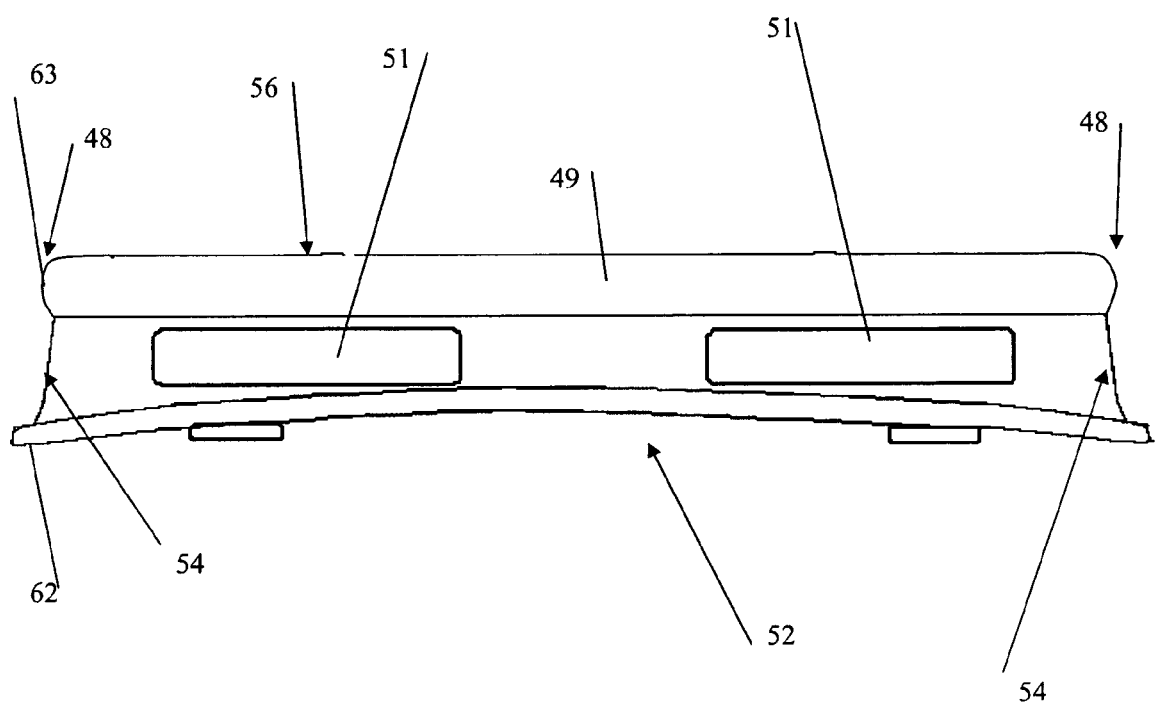
FIG. 10 is an end view of an alternative embodiment of the cover of FIG. 6.

Shown in FIG. 8 is an alternative embodiment of the body 21 with separate side 48 and first end 49 grip portions. Shown in FIG. 10 is an alternative embodiment of the grip portions 48 and/or the grip portion 49, such that the portions 48, 49 can have a projected surface 63 (e.g. protrusion—see FIG. 10) directed/projected outwardly from the corresponding side wall portion 54 (and/or distal end wall 52), so as to form a concave surface of the side 54 and/or distal end 52 portions that is configured for conforming to a convex profile of the user's (e.g. index) finger (see FIG. 11), as compared to the more substantially flush arrangement between the grip portions 48 and/or the grip portion 49 and the adjacent side wall 54 and/or distal end wall 52 (as shown in FIG. 6). It is recognised that the protrusion 63 may be provided by a thickness of the grip portion 48,49 attached to the cover housing 21, may be provided by an integral extension of the material of the cover housing 21 (e.g. molded), may be an attached rigid extension to the cover housing 21, or may be any combination thereof.

Figure 9:
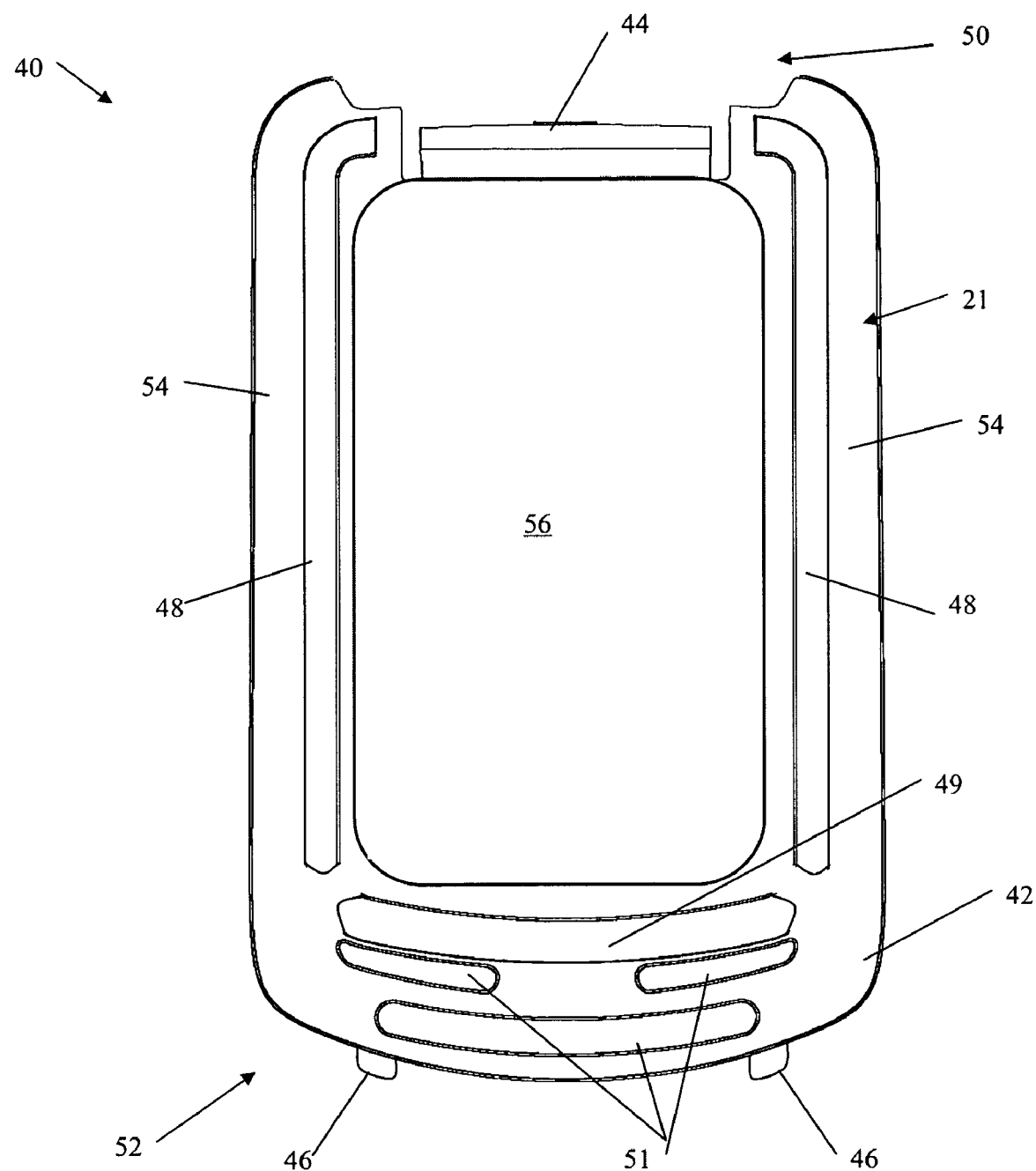
FIG. 9 is top view of a further alternative embodiment of the cover of FIG. 3.

It is recognised that the side grip portion(s) 48 may be positioned on both the side portion(s) 54 and the cover surface 56 (as shown in FIG. 3)—for example as extending from the side portion 54 to the cover surface 56 including a corner region 60 (see FIG. 5), and/or the side grip portion(s) 48 may be positioned only on the side portion(s) 54 and not on the corner region 60 and/or the cover surface 56 (shown in FIG. 9), as desired. Further, it is recognised that the first end grip portion 49 may be positioned on both the distal portion 52 and the cover surface 56 (as shown in FIG. 3)—for example as extending from the distal portion 52 to the cover surface 56 including a corner region 60 (see FIG. 5), and/or the first end grip portion 49 may be positioned only on the distal portion 52 and not on the corner region 60 and/or the cover surface 56 (shown in FIG. 8), as desired.

The grip portions 48,49,51 are preferably made of a resilient material (e.g. rubber or other elastomeric material), a textured rigid material, a textured resilient material, or a combination thereof. The grip portions 48,49,51 are configured for enhancing a grip between the user's index finger 82, and/or the user's middle finger 84, and the cover 40.

Figure 14:
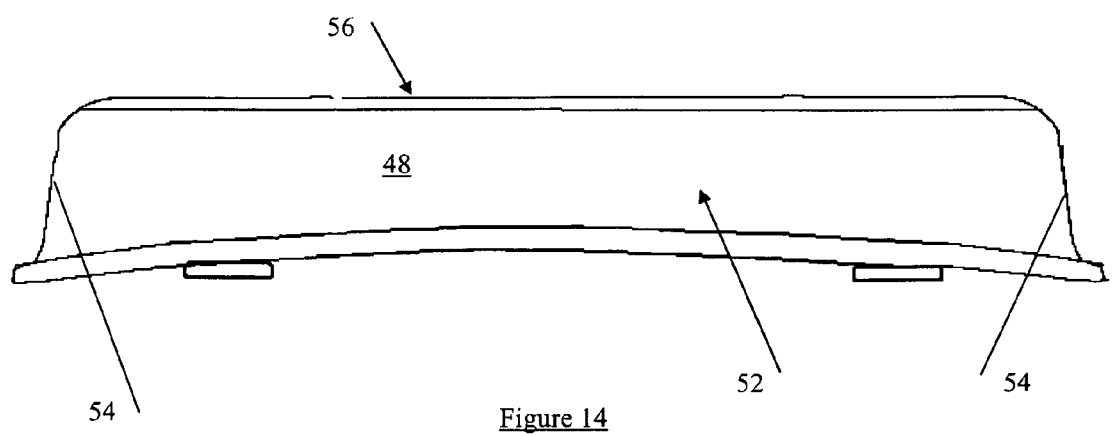
FIG. 14 is an alternative embodiment of the cover of FIG. 6.
Figure 15:
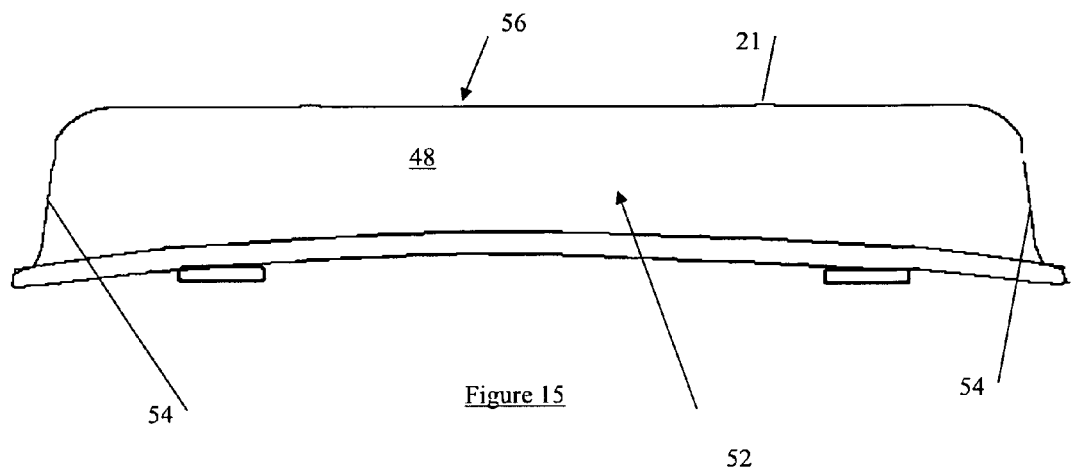
FIG. 15 is a further alternative embodiment of the cover of FIG. 6.

The grip portions 48, 49, 51 can be overmolded to the body 21 of the cover 40, and/or adhered to the body 21 using adhesive or some other bonding agent that is compatible with the material of the body 21 and the material of the grip portions 48,49,51. Further, it is recognised that the grip portions 48, 49, 51 can be integral to the material of the body 21 and therefore presented as textured regions of the body 21 material. In any event, it is recognised that the grip portion(s) 48, 49, 51 can be composed of different material and/or texture than that of the remainder of the material and/or texture composition of the body 21. It is also recognised that the grip portions 48, 49, 51 can be positioned over a portion of the surface of the side wall 54 and distal end wall 52 as shown, and/or can be positioned over the entire surface of the side wall 54 and/or distal end wall 52, as shown in FIG. 14. Further, as shown in FIG. 15, the grip portion 48 can be attached over the exterior surface of the housing 21, including the side wall(s) 54, the cover surface 56, and the end wall 52.

One above-discussed embodiment of the grip portions 48,49,51 can be expressed as an overmold portion attached (e.g. adhered or otherwise bonded to the cover housing 21 and/or the enclosure 23), preferably made of a resiliently flexible material (e.g. rubber or other suitable polymers), for enhancing the grip of the user's hand on the body 21 of the cover 40. The overmold can be referred to as an additional layer formed around the first part (e.g. body 21) that can be a previously molded part that is reinserted into a secondary mold for forming the additional layer on the previously molded part. For example, after injection and forming of the first molded part, i.e. the body 21, the component is rotated on a core from the one mold cavity to another. The second mold cavity is different from the first mold cavity in that the detail for the second molded part is included and used to add the overmolded grip portion(s) 48, 49, 51.

The material (e.g. rubberized polymer) for the second molded part (i.e. the overmold grip portion 48, 49, 51) is then injected into the second mold cavity detail before the completed part (i.e. body 21 and overmold grip portions 48, 49, 51) is ejected from the second mold. It is recognised that one example embodiment of the cover 40 is where the body 21 is made of a hard/rigid plastic material (e.g. thermoplastic polymer) while the overmold grip portion(s) 48, 49, 51 is made of a softer, resilient material (e.g. thermoplastic elastomer (TPE) materials) that is adhered to the material/substrate (e.g. polypropene (PP), acrylonitrile-butadiene-styrene (ABS), polycarbonate (PC), Nylon etc.) of the body 21, thus facilitating a combined comfortable, non-slip, and abrasion-resistant grip portion(s) 48, 49, 51 of the cover 40 for facilitating the grip between user's index and/or middle finger and the side portion(s) 54 and/or distal end portion 52. It is recognised that other fabrication methods can be used to assemble the overmold to the body 21 of the cover 40, as known to a person skilled in the art.

It is recognised that the grip portion(s) 48, 49, 51 can have a material composition, texture, colour, and/or shading different from the material of the body 21.

Coupling of Cover 40 and Enclosure 23

The following description provides one example embodiment of the coupling between the enclosure 23 and the cover 40 as removable (i.e. releasably secured). It is recognised that the body 21 (see FIG. 3) of the cover 40 could be alternatively configured so as to be integral (i.e. permanently affixed) to the enclosure 23 of the computer 24, for example as part of the molded enclosure 23, as a separately molded component adhered (e.g. glued or otherwise bonded) to the enclosure 23, etc, or using other techniques as would be apparent to one skilled in the art. In the case of the cover 40 being non-removable (i.e. not separable) with respect to the rest of the enclosure 23, it is recognised that the enclosure 23 could be configured to open (not shown) in order to facilitate changing of the battery 36 as needed.

Referring to FIG. 3, shown is a top view of the exterior of the cover 40. The cover 40 has a body 21 with a proximal portion 50 having a latch 44 for engaging with a corresponding receptacle (not shown) of the enclosure 23, and a distal portion 52 having one or more protrusions 46 for mating/engaging with one or more corresponding slots (not shown) of the enclosure 23. The latch 44, corresponding receptacle, protrusions 46 and corresponding slots can be referred to as a connection 41. Further, it is recognised that the slots can be located on the enclosure 23 and the protrusions 46 located on the body 21 as shown, the slots can be located on the body 21 and the protrusions 46 located on the enclosure 23 (not shown), or a combination thereof. Further, the latch 44 can be located on the body 21 and the corresponding receptacle on the enclosure 23 (as shown), the latch 44 can be located on the enclosure 23 and the corresponding receptacle on the body 21 (not shown), or a combination thereof.

Referring again to FIG. 3, the mechanical coupling is configured so as to facilitate attachment of the cover 40 to the enclosure 23 without the aid of additional tools and corresponding fasteners (e.g. screwdrivers and screws, etc.). Further, the mechanical coupling is configured so as to be compatible with a specified drop rating of the portable terminal 10, while facilitating the retention of the cover 40 to the enclosure 23, once attached, until subsequently released by the user through operation of the latch 44. In order to attach the cover 40 to the enclosure 23, for example, the protrusions 46 can be engaged/inserted into the slots of the enclosure 23 and then the cover 40 can be pivoted about the engaged protrusions 46 and slots towards the enclosure 23 so as to engage the latch 44 with the corresponding receptacle of the enclosure 23.

Referring to FIGS. 1 and 4, once the cover 40 is coupled to the enclosure 23, via engagement of the protrusions 46 and latch 44 with the corresponding slots and receptacle of the enclosure 23, a mating surface 62 of the side wall portions 54 and the distal end wall portion 52 is positioned adjacent to an external surface 68 of the enclosure 23. It is recognised that the mating surface 62 can be configured to accommodate the shape of the enclosure surface 68 (see FIG. 1).

Further, in view of the above, it is recognised that the cover 40 can be attached to the enclosure 23 via a plurality of fasteners (e.g. screws), which can be configured to releasably secure/couple the cover 40 to the enclosure 23, as desired.

Further, it is recognised that the assembly the cover housing 21 to the enclosure 23 with respect to the opening/aperture 124 (see FIG. 3,6) such that the mating surface 62 is received in the depression 120 in the bottom surface 67,68 provided in the enclosure 23. The compartment 122 can be configured in one embodiment for holding a battery, such that the cover housing 21 includes the releasably secure connection 41 (e.g. for coupling the cover housing 21 to the enclosure 23.)

Operation of the Coupled Cover 40 to the Enclosure 23

Referring to FIG. 11, the at least one of the cover side walls 54 and the cover distal end wall 52 are dimensioned in lengths LD and LW so as to accommodate the index finger (for example) extending along the cover side wall 54 and the cover distal end wall 52. Further, the cover housing 21 has a separation distance D between the pair of cover sidewalls 54 configured so as to accommodate the middle finger (for example) of the user extending from one of the pair of cover sidewalls 54 and along the cover surface 56 and grasping the other of the cover side walls 54.

Interior 88

Figure 16:
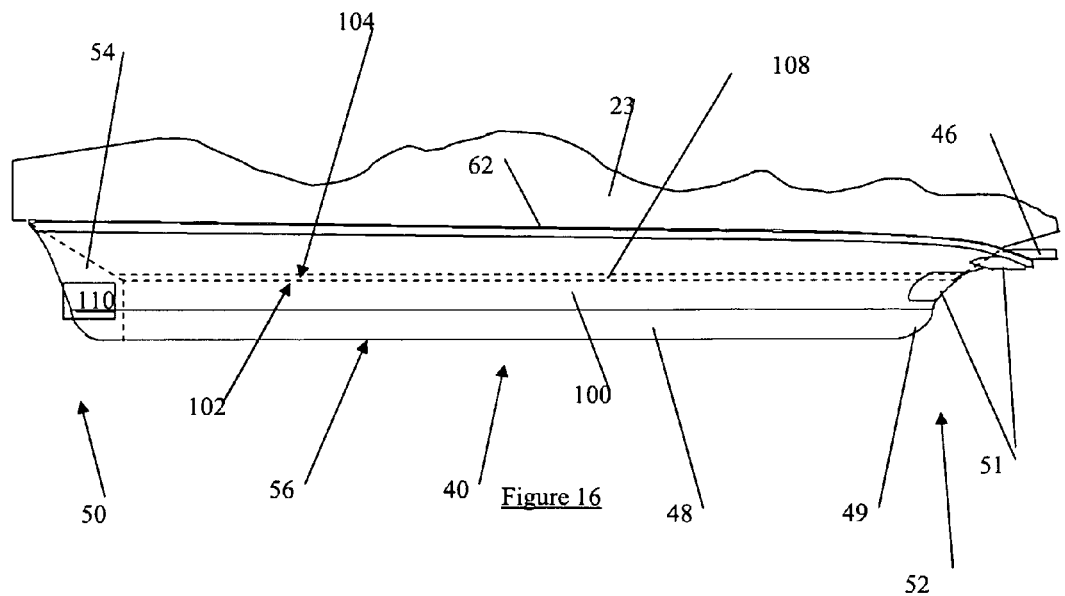
FIG. 16 shows a side view of the cover of FIG. 5.

Referring to FIG. 4, shown is an example interior 88 configuration of the cover 40. The cover 40 has a resilient portion 100 contained in the interior 88, sized so as to fit (e.g. continuously extend) around a periphery of the power source 36, such that the portion 100 has a sealing surface 102 configured for mating with a corresponding surface 104 of the enclosure 23 (see FIG. 16). The surface 104 can have a sealing rib 108 extending outwardly from the surface 104, for example the sealing rib made of the rigid material of the enclosure housing 23. The resilient portion 100 is adhered or otherwise affixed to the inside surface of one or more of the side wall portions 54, the distal end wall portion 52 and/or the cover surface 56, so as to inhibit the penetration of foreign matter (e.g. moisture) between the body 21 (of the cover 40) and the resilient portion 100 and into the interior 88 where the power source 36 is to be situated. Accordingly, the resilient portion 100 provides a foreign matter resistant barrier between the body 21 of the cover 40 and the sealing surface 104 of the enclosure 23, in order to prevent contamination/damage of the power source 36 due to foreign matter penetration.

The resilient portion 100 is preferably made of a resilient material (e.g. rubber or other elastomeric material). The resilient portion 100 can be overmolded to the body 21 of the cover 40, and/or adhered to the body 21 using adhesive or some other bonding agent that is compatible with the material of the body 21 and the material of the resilient portion 100. One embodiment of the overmolded reslient portion 100 is preferably made of a resiliently flexible material (e.g. rubber or other suitable polymers), for enhancing the moisture resistant seal between the body 21 of the cover 40 and that of the enclosure 23. It is recognised that one example embodiment of the cover 40 is where the body 21 is made of a hard/rigid plastic material (e.g. thermoplastic polymer) while the overmold resilient portion 100 is made of a softer, resilient material (e.g. thermoplastic elastomer (TPE) materials) that is adhered to the material/substrate (e.g. polypropene (PP), acrylonitrile-butadiene-styrene (ABS), polycarbonate (PC), Nylon etc.) of the body 21.

Referring again to FIG. 4, shown is a magnet 106 for insertion 107 into a receptacle 108 formed in the resilient portion 100. The receptacle 108 in the resilient portion 100 has one or more cross sectional dimensions 109a (e.g. diameter if circular, length and width if rectangular or square, etc.) and a depth dimension 111a (see FIG. 5). The magnet 106 has one or more cross sectional dimensions 109b (e.g. diameter if circular, length and width if rectangular or square, etc.) and a depth dimension 111b (see FIG. 5), such that the magnitude of the dimension(s) 109b is sized accordingly for the magnet 106 to fit within the receptacle 108.

Due to the resiliency of the material of the resilient portion 100, the dimension(s) 109a of the receptacle 106 can be less than (or equal to) the dimension(s) 109b of the magnet 106, thereby facilitating a stretching of the material of the receptacle 108 during insertion 107 of the magnet 106 therein. Accordingly, the magnet 106 can be retained in the cover 40 due to frictional forces between the walls of the magnet 106 and the walls of the receptacle 106 and/or by compression (i.e. compressive forces due to the dimension 109a being less than 109b and the resultant stretching of the material of the resilient portion 100) of the walls of the receptacle 108 on the walls of the magnet 106. It is also recognised that the dimension(s) 109a of the receptacle 108 can be greater than the dimension(s) 109b of the magnet 106, thereby using an adhesive or other bonding agent to affix/retain the magnet 106 in the receptacle 108, once inserted 107. It is recognised that the receptacle 108 can be integral to the resilient portion 100 operable as the seal between the body 21 and the enclosure 23 (e.g. in the region of the power source 36) or can be a secondary resilient portion 100 that is separate from the resilient portion 100 operable as the seal between the body 21 and the enclosure 23.

Alternatively, is also recognised that the receptacle 108 can be made of material (e.g. rigid polymer) similar to the body 21 of the cover 40, as desired. In this case, tolerances between the dimension(s) 109b of the magnet 106 and the dimension(s) 109a of the receptacle 106 are matched so that the magnet 106 can be inserted 107 into the receptacle 108. Further in this case, an adhesive or other bonding agent can be used to affix/retain the magnet 106 in the receptacle 108, once inserted 107.

Referring again to FIG. 4, shown is a representative example of the enclosure 23 containing a reed switch 110 coupled to one or more computer components 112 (e.g. processor 32 and/or other computer circuits) of the computer 24 (see FIG. 1). The reed switch 110 is configured so as to affect the operation of one or more of the components 112 of the computer 24 via the instruction/control signal(s) 114 generated through physical interaction of the reed switch 110 in close proximity with the magnet 106. In other words, the reed switch 110 is a mechanical device that is activated by the presence of the magnetic field of the magnet 106.

For example, the reed switch 110 contains two magnetizable and electrically conductive metal reeds (e.g. contacts), which have end portions separated by a small gap when the switch 110 is open. The reeds can be hermetically sealed in opposite ends of a tubular glass envelope. The magnetic field (from an electromagnet or a permanent magnet 106) will cause the contacts to pull together, thus completing an electrical circuit (e.g. generating the instruction/control signal(s) 114 for the component(s) 112). The stiffness of the reeds causes them to separate, and open the circuit, when the magnetic field of the magnet 106 ceases. A more complicated configuration of the switch 110 can contain a non-ferrous normally closed contact that opens when the ferrous normally open contact closes. The switch 110 is configured for sensitivity that is compatible with the magnetic field strength of the magnet 106 located in proximity to the switch 110 in the receptacle 106 of the cover 40 (when coupled to the enclosure 23). The sensitivity of the reed switch 110 is the amount of magnetic energy (e.g. strength of the magnetic field) necessary to actuate the contacts. For example, sensitivity is measured in units of Ampere-turns (AT), corresponding to the current in a coil multiplied by the number of turns. Typical pull-in (e.g. contact actuation) sensitivities for reed switches 110 can be in the 10 to 60 AT range.

In operation, as the magnet 106 comes in close proximity to the switch 110, the magnetic field will cause the contacts of the switch 110 to change state (e.g. from a closed state to an open state or from an open state to a closed state). For example, the receptacle 106 is positioned adjacent to the proximal cover end wall 50 that is adjacent to the proximal end wall 90 of the enclosure 23, such that the switch 110 is located in the interior of the enclosure 23 between the compartment 122 and the proximal end wall 90.

The change in state of the contacts of the reed switch is used by the component(s) 112 of the computer 24 as the instruction/control signal(s) 114 to modify their operational behaviour (e.g. to shut down). For example, when the cover 40 is installed/coupled to the enclosure 23, the magnet 106 is positioned in close proximity to the reed switch 110 such that the presence of the magnetic field maintains the state of the contacts in a first state. The component(s) 112 of the computer 24 are operable in accordance with the first state of the contacts. Upon removal of the cover 40 from the enclosure 23, the magnet 106 is removed from the proximity of the reed switch 110 (e.g. a separation distance is increased between the magnet 106 and the reed switch 110), such that the reed switch does not sense the presence of the magnetic field of the magnet 106. In this case, the contacts change from the first state to a second state and the component(s) 112 are instructed to change their operable behaviour (e.g. to shut down in the case of the processor 32, fail to recognize/process the actuation signal 42 of the actuation mechanism 43, etc.).

Accordingly, in view of the above the portable terminal 10 assembly comprises the enclosure 23 having the distal end wall 92 and the proximal end wall 90 connected to the pair of sidewalls 94 such that the enclosure walls 90,92,94 connect the bottom surface 67,68 to a top surface 27 having a user interface 26 to define an enclosure interior. The enclosure 23 has the power source compartment 122 positioned in the enclosure interior. The cover couples to the compartment 122 situated in the opening 124 in the bottom surface 67, 68. The cover housing 21 of the cover 40 includes the cover surface 56, the pair of cover sidewalls 54, the proximal cover end wall 50 and the distal cover end wall 52 such that the cover walls 50, 52, 54 extend from the cover surface 56 to define the cover interior 88. The magnet 106 is coupled to the cover interior, such that the magnet 106 has a sufficient magnetic field strength for affecting the state of the contacts of the switch 110. The switch 110 is mounted in the interior of the enclosure 23, such that the switch 110 is coupled to at least one component 112 receiving power from the power source 36 when positioned in the compartment 122. It is recognised that the proximity of the magnet 106 to the switch 110 affects the state of the contacts and therefore the supply of power to the at least one component 112.

We claim:

1. A portable terminal assembly comprising:
    an enclosure having a distal end wall and a proximal end wall connected to a pair of sidewalls such that the enclosure walls connect the bottom surface to a top surface having a user interface to define an enclosure interior, a power source compartment positioned in the enclosure interior;
    a cover for coupling to the compartment situated in an opening in the bottom surface;
    a cover housing of the cover including a cover surface, a pair of cover sidewalls, a proximal cover end wall and a distal cover end wall such that the cover walls extend from the cover surface to define a cover interior;

a magnet coupled to the cover interior, the magnet having a sufficient magnetic field strength for affecting a state of contacts of a switch; and the switch mounted in the interior of the enclosure, the switch coupled to at least one component receiving power from a power source when positioned in the compartment;

wherein the proximity of the magnet to the switch affects the state of the contacts and therefore the supply of power to the at least one component.

2. The assembly of claim 1 further comprising a mating surface at a base of the cover housing and configured to mate with a sealing surface of the compartment, the cooperation of the mating surface and the sealing surface when mated for inhibiting penetration of foreign matter into the compartment from a surrounding environment.

3. The assembly of claim 2 further comprising a resilient portion connected to an interior surface of the cover interior for providing the mating surface, the resilient portion extending around a periphery of the cover interior.

4. The assembly of claim 3, wherein the resilient portion is an overmold.

5. The assembly of claim 3 further comprising a receptacle coupled to the cover housing for receiving the magnet and retaining the magnet in the cover interior.

6. The assembly of claim 5, wherein the receptacle is included as integral to the material of the resilient portion.

7. The assembly of claim 6 further comprising one or more cross-sectional dimensions of the receptacle to be less than one or more cross-sectional dimensions of the magnet for facilitating a frictional grip connection between an interior surface of the receptacle and an exterior surface of the magnet.

8. The assembly of claim 7, wherein a cross-sectional shape of the magnet is circular and a cross-sectional shape of the receptacle is also circular, such that the diameter of the receptacle is less than the diameter of the receptacle.

9. The assembly of claim 5, wherein the receptacle is positioned adjacent to the proximal cover end wall that is adjacent to the proximal end wall of the enclosure, such that the switch is located in the interior of the enclosure between the compartment and the proximal end wall.

10. The assembly of claim 2 further comprising magnet field strength configured so that when the cover is coupled to the compartment in proximity to the switch, the magnetic field causes the contacts of the switch to change state and the state of the contacts switch is used by the at least one component as an control signal to modify its operational behaviour.

11. The assembly of claim 10, wherein the modification of the operational behaviour is for shutting down.

12. The assembly of claim 11, wherein the switch is a reed switch.

13. A cover for coupling to a power source compartment situated in an opening in a surface of an enclosure of portable terminal, the portable terminal including the enclosure having a distal end wall and a proximal end wall connected to a pair of sidewalls such that the enclosure walls connect the bottom surface to a top surface having a user interface to define an enclosure interior, the compartment positioned in the enclosure interior, the cover comprising:

a housing including a cover surface, a pair of cover sidewalls, a proximal cover end wall and a distal cover end wall such that the cover walls extend from the cover surface to define a cover interior;

a magnet coupled to the cover interior, the magnet having a sufficient magnetic field strength for affecting a state of contacts of a switch;

wherein the switch is mounted in the interior of the enclosure.

14. The cover of claim 13 further comprising a mating surface at a base of the cover housing and configured to mate with a sealing surface of the compartment, the cooperation of the mating surface and the sealing surface when mated for inhibiting penetration of foreign matter into the compartment from a surrounding environment.

15. The assembly of claim 13 further comprising a resilient portion connected to an interior surface of the cover interior for providing the mating surface, the resilient portion extending around a periphery of the cover interior.

16. The assembly of claim 15, wherein the resilient portion is an overmold.

17. The assembly of claim 15 further comprising a receptacle coupled to the cover housing for receiving the magnet and retaining the magnet in the cover interior.

18. The assembly of claim 17, wherein the receptacle is included as integral to the resilient portion.

19. The assembly of claim 17 further comprising one or more cross-sectional dimensions of the receptacle to be less than one or more cross-sectional dimensions of the magnet for facilitating a frictional grip connection between an interior surface of the receptacle and an exterior surface of the magnet.

20. The assembly of claim 19, wherein the receptacle is positioned adjacent to the proximal cover end wall that is adjacent to the proximal end wall of the enclosure, such that the switch is adapted for being located in the interior of the enclosure between the compartment and the proximal end wall.

* * * * *